(12) United States Patent
Nishimura et al.

(10) Patent No.: US 10,088,745 B2
(45) Date of Patent: Oct. 2, 2018

(54) PELLICLE FOR EUV EXPOSURE

(71) Applicant: SHIN-ETSU CHEMICAL CO., LTD., Tokyo (JP)

(72) Inventors: Akinori Nishimura, Annaka (JP); Toru Shirasaki, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 42 days.

(21) Appl. No.: 15/379,731

(22) Filed: Dec. 15, 2016

(65) Prior Publication Data

US 2017/0184955 A1 Jun. 29, 2017

(30) Foreign Application Priority Data

Dec. 24, 2015 (JP) ................. 2015-251238

(51) Int. Cl.
*G03F 1/64* (2012.01)
*G03F 1/62* (2012.01)
*G03F 7/20* (2006.01)

(52) U.S. Cl.
CPC .................. *G03F 1/64* (2013.01); *G03F 1/62* (2013.01); *G03F 7/2004* (2013.01)

(58) Field of Classification Search
CPC ..................................... G03F 1/64; G03F 1/62
USPC ............................................................ 430/5
See application file for complete search history.

(56) References Cited

U.S. PATENT DOCUMENTS

| | | | |
|---|---|---|---|
| 2004/0137339 A1* | 7/2004 | Zhang | G03F 1/64 430/5 |
| 2005/0048380 A1 | 3/2005 | Nagata | |
| 2009/0104544 A1* | 4/2009 | Kubota | B82Y 10/00 430/5 |
| 2010/0328635 A1* | 12/2010 | Sekihara | G03F 1/64 355/30 |

FOREIGN PATENT DOCUMENTS

| | | |
|---|---|---|
| EP | 3 079 013 A2 | 10/2016 |
| JP | 2009-151335 A | 7/2009 |
| WO | 2014/188710 A1 | 11/2014 |

OTHER PUBLICATIONS

Akiyama, S. et al, "Development of EUV Pellicle with Single Crystal Silicon Membrane", 2010 International EUVL Symposium Kobe, Japan, Oct. 2010, pp. 1-20.
European Search Report dated May 9, 2017, issued in counterpart European Application No. EP 16 20 3462. (2 pages).

* cited by examiner

*Primary Examiner* — Christopher G Young
(74) *Attorney, Agent, or Firm* — Westerman, Hattori, Daniels & Adrian, LLP

(57) ABSTRACT

There is provided a pellicle for EUV lithography, which has a filter attached to a vent hole made through a pellicle frame bar for air pressure adjustment, and this filter is designed to be heat-resistant by being made of either a metal or a ceramic material, and is adhered to the pellicle frame by weldering or soldering, and also the filter has a filtration accuracy of 0.1 through 0.3 μm.

13 Claims, 1 Drawing Sheet

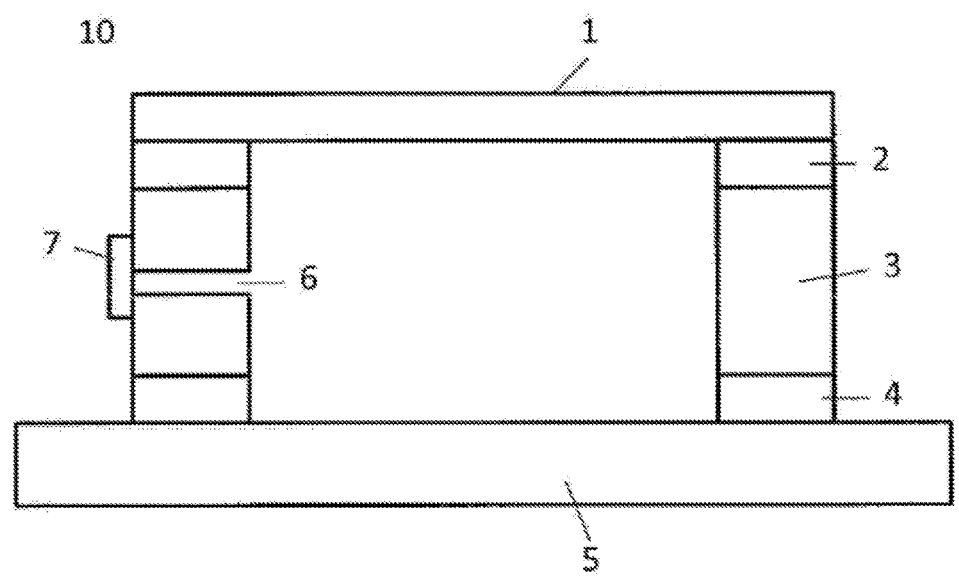

PELLICLE FOR EUV EXPOSURE

The present non-provisional patent application claims priority, as per Paris Convention, from Japanese Patent Application No. 2015-251238 filed on 2015 Dec. 24, the disclosure of which is hereby incorporated by reference herein in its entirety.

FIELD OF THE INVENTION

The present invention relates to a pellicle for EUV exposure, which is used as a dust fender for a photomask or a reticle for lithography employed in the scenes of manufacturing semiconductor devices such as LSI and Super-LSI, and liquid crystal display panels, etc.

BACKGROUND TECHNOLOGY

In recent years, the design rule for LSI has been progressively adopting more micronized orders of sub-quarter micron, and as a result the shortening of the wavelength of the exposure light source has been compelled. Thus, the exposure light source has been shifted from g-line (436 nm) and i-line (365 nm) lights of the mercury lamp to KrF excimer lasers (248 nm) and ArF excimer lasers (193 nm), and furthermore the EUV light exposure using EUV (13.5 nm) is being studied.

In manufacturing semiconductor devices such as LSI and Super-LSI or in manufacturing a liquid crystal display board, a pattern is made by irradiating a light to a semiconductor wafer or an original plate for liquid crystal; however, if a dust adheres to a photomask for lithography (also simply referred to as "mask") or a reticle (these are collectively referred to as "exposure original plate" herein below) used in this pattern creating stage, the dust absorbs light or bends it, causing deformation of a transferred pattern, roughened edges or black stains on a base, and leads to problems of damaged dimensions, poor quality, deformed appearance and the like.

For this reason, the above-mentioned lithography works are usually performed in a cleanroom, but even so, it is still difficult to keep the exposure original plate clean all the time; therefore, in general the light irradiation is carried out only after a surface of the exposure original plate is sheltered by a pellicle. In this way, the dust particle is prevented from directly adhering to the surface of the exposure original plate but is caught on the pellicle, and if, at the time of the lithography, the exposure light is focused on the pattern described on the exposure original plate the dust particle on the pellicle does not partake in the image transferring.

The basic structure of a pellicle is such that a pellicle membrane having a high transmittance against lights used in exposure light procedure is tensely adhered to an upper end face of a pellicle frame, and a gasket is adhered to a lower end face of the pellicle frame as an airtight member. For this airtight gasket an agglutinant layer is used in general. Also, the pellicle membrane is made of cellulose nitrate, cellulose acetate and a fluorine-containing polymer or the like which transmit well such lights that are used in light exposure (e.g., g-line [430 nm], i-line [365 nm], KrF excimer laser [248 nm], and ArF excimer laser [193 nm]). Further, of late, as a pellicle membrane for EUV exposure a use of a single crystal silicon membrane having an extra thin thickness such as 1 μm or smaller or in particular 10 nm-1 μm is being studied.

This pellicle is provided for the purpose of preventing dusts from adhering to the exposure original plate so that the pattern-containing region of the exposure original plate is to be isolated from the atmosphere outside the pellicle so as to be free of dust in the atmosphere. Then, to install the pellicle, the agglutinant layer of the pellicle is pressed against the exposure original plate for adhesion in a manner such that the pattern-containing region formed on the surface of the exposure original plate is fully enclosed inside the pellicle frame.

On this occasion, a closed space defined by the pellicle membrane, the pellicle frame and the exposure original plate is created, and since this closed space is an airtight space, when the atmospheric pressure changes, a differential pressure between the inside and outside of the closed space would work upon the pellicle membrane. Now, if the membrane is made of a resin such as fluorine-containing polymer, the pellicle frame would swell outwardly or inwardly. To prevent this a pressure adjustment hole may be made through a side bar of the pellicle frame and further a filter may be put to cover the hole so as to prevent dust from passing into the closed space.

In the case where conventional i-line [365 nm], g-line [436 nm], KrF excimer laser [248 nm], or ArF excimer laser [193 nm] is used, the exposure procedure is conducted in the atmosphere within a cleanroom and the filter is generally made of a resin such as PTFE. In IP Publication 1 teaches that the filter provided to a pressure adjustment hole for dust prevention can be made of a stainless steel or a ceramic as well as a resin such as PTFE; however, in practice, when the exposure procedure is conducted in the atmosphere, as will be shown in an example, the filter is often made of a resin such as PTFE for its low cost and simplicity, stainless steel and ceramic are scarcely used.

On the other hand, in the case of EUV exposure procedure, which is conducted in vacuum or under reduced-pressure atmosphere, vacuum drawing is carried out at the time when the mask is brought in the exposure apparatus or brought out from it. If an extremely thin silicon film having a thickness of 1 μm or smaller, or preferably between 20 nm and 1 μm, and having a high transmittance for EUV light is used as the pellicle membrane, it is feared that a stress caused by a slight change in surrounding pressure may break the silicon film, and to prevent this by mitigating such differential pressure between the inside and the outside of the closed space, a pressure adjustment hole is made through a frame side bar to communicate between the inside and the outside of the closed space whereby air is allowed to pass through the hole. Also, in order to prevent a dust from passing into the closed space, a filter is provided to cover the pressure adjustment hole.

PRIOR ART PUBLICATION

IP Publication

[IP Publication 1]
Japanese Patent Application Publication No. 2007-333910

SUMMARY OF THE INVENTION

Problems the Invention Seeks to Solve

Now, since, in the EUV exposure procedure as described above, it is necessary to maintain the inside atmosphere of the exposure chamber at a vacuum or at a reduced pressure, there also occurs a problem that the pellicle frame would have a high temperature during the EUV exposure proceeding. In other words, the EUV light is diffracted on the mask pattern and this diffracted light would hit the pellicle frame and the temperature of the pellicle frame would go up since thermal radiation is hard to occur in a vacuum. Under the circumstances, if a resin such as conventionally used PTFE is used as the material for the filter for a pellicle for EUV exposure application, then due to the poor heat resistivity, the filter is liable to detach when the pellicle comes to have a high temperature.

It is also feared that a resin filter could create an extensive amount of outgas as it is heated at a high temperature. When such outgas is generated, it would contaminate the ultra-thin pellicle membrane made of silicon having a thickness of 20 nm-1 µm and also the mask, whereby it may become impossible to form a fine pattern. Therefore, in EUV Exposure procedure, there is a problem that it is difficult to adopt a filter made of a resin, which has been commonly used in the pellicle for conventional exposure procedure involving KrF or ArF excimer lasers.

Thus, the present invention was made in view of the above-stated problems and it is an object thereof to provide such a pellicle suitable for EUV exposure that, when EUV exposure procedure is conducted using a ultra-thin pellicle membrane of silicon having a thickness of 1 µm or thinner and having a high transmittance against EUV light in an atmosphere of vacuum or a reduced pressure, the pellicle's filter is so heat resistant that it would not detach and the filter's air-pass speed (pressure reduction time) is so high that the pellicle membrane would not break while the efficiency of capturing foreign materials is high.

Means to Solve the Problems

In order to achieve the above-stated objects the present invention is proposed to be about such a pellicle for EUV exposure procedure that is composed of (i) a pellicle frame having an upper end face and provided with a vent hole for pressure adjustment, said vent hole being covered with a filter for stopping particles from entering the vent hole, and (i) a pellicle membrane having a thickness of 1 µm or smaller, made of single crystal silicon, polycrystalline silicon, or amorphous silicon, and being tensely adhered to the upper end face of the pellicle frame, the said pellicle being characteristic in that the said filter is made of a metal or a ceramic, that the said filter is integrally formed continuously with the pellicle frame either by welding or by soldering, wherein latter a low melting point solder alloy is used, and that the said filter has a filtration accuracy in a range of 0.1 through 0.3 µm, which means that when filter size is 36 mm in diameter and the air flow rate is 2.95 L/min./cm² and particles having a grain size of 0.1 through 0.3 µm are passed through the filter, then an initial removal efficiency is 88% or higher.

Effects of the Invention

According to the present invention, since it is possible to adopt a material such as single crystal silicon, polycrystalline silicon or amorphous silicon, which has high transmitting property against EUV light, to make a pellicle membrane having a thickness of 1 µm or smaller, now it has become possible to form a highly accurate and condensed pattern in an atmosphere of vacuum or reduced pressure.

Also, since a metallic or ceramic filter having a filtration accuracy in a range of 0.1 through 0.3 µm is used, the filter can withstand high temperatures and thus can maintain its ability of passing air at high speed, at the same time maintaining a high particle capturing ability; furthermore, since the filter is continuously integrated with the pellicle by welding or soldering so that the filter does not detach from the pellicle even at a high temperature.

BRIEF DESCRIPTION OF DRAWINGS

FIG. 1 is a longitudinal section view of an embodiment of a pellicle of the present invention.

Examples of How the Invention is Embodied

Now, one embodiment of the present invention will be explained in detail using the drawings as a reference. In this pellicle 10, a pellicle membrane 1 made of silicon and having a thickness of 1 µm or smaller or preferably between 20 nm and 1 µm is tensely adhered via an adhesive 2 to a pellicle frame 3, which has a size and shape (normally a quadrilateral frame) roughly proportionate to those of a mask 5. If the thickness of the membrane is more than 1 µm, the amount of the exposure light that transmits the membrane is substantially reduced so that the thickness ought to be 1 µm or smaller; however, when the thickness of the membrane is excessively thin, it becomes difficult to manufacture and handle it so that a thickness of from 20 nm through 1 µm is preferred, or more preferably from 100 nm through 1 µm.

On a lower end face of the pellicle frame 3 is laid a layer of an agglutinant 4 for the purpose of enabling the pellicle 10 to be glued to the mask 5. Furthermore, a liner (not shown) is detachably adhered to the exposed face of the agglutinant layer so as to protect that face. The pellicle frame 3 is formed with a vent hole(s) 6 for air pressure adjustment, and this vent hole 6 is provided with a filter 7 for preventing dust particles from entering the vent hole 6.

The filter 7 of the present invention is made of a metal or a ceramic, which are excellently heat resistant, and has a filtration accuracy of 0.1 through 0.3 µm. The "filtration accuracy" of a filter is defined, for the purpose of this specification, as the range of grain size of certain particles, e.g. 0.1-0.3 µm, with which the filter can score the initial removal efficiency of 88% or higher, when a test is conducted in which the filter size is 36 mm in diameter and the air flow rate is 2.95 L/min./cm². If this filtration accuracy is smaller than 0.1 µm, the efficiency of air pressure adjustment becomes so poor (in terms of the air pressure adjustment speed) that it is not practical. Also, if the filtration accuracy exceeds 0.3 µm, it is feared that dust could penetrate into the vent hole and thus such is not acceptable. In the present invention, since the filtration accuracy of from 0.1 through 0.3 µm is adopted, while no outgas is generated even when the temperature of the pellicle frame becomes high during the EUV exposure procedure due to the kind of the material the filter is made of, it is possible to sufficiently prevent the dust particles from entering the vent hole without interfering with the air pressure adjustment efficiency.

As for the material to make the filter 7, it is possible to adopt a pure metal or an alloy, and it is also possible to add some non-metallic substance so long as the amount added does not affect the effect of the invention. In particular, stainless steel, hastelloy, monel, inconel, nickel, or the like may be used, while there is no limit to the choice. Also, it is possible to use a filter made of ceramic material since it is similarly heat resistant and does not generate outgas. In particular, ceramics such as titania, zirconia, ferrite, alumina, zircon, or mullite may be used.

The filter 7 of the present invention is positioned to cover at least a part of the air pressure adjustment vent hole 6 made in the pellicle frame 3. In this positioning, the filter 7 may be fixed to the pellicle frame 3 using a conventional organic adhesive; however, when the pellicle frame 3 becomes heated due to the exposure light irradiation, it is feared that the adhesive fails to hold the filter and can also generate outgas; to deal with this problem, the filter 7 is welded to the pellicle frame 3. In this case since no adhesive material is used, there is no fear that the filter detachment and the outgas generation would occur.

Also, it is possible to solder the filter 7 to the pellicle frame 3 using a soldering material that has a melting point lower than those of the materials of which the filter 7 and the pellicle frame 3 are made, such as a solder alloy or a lead-free solder alloy. If the filter 7 is soldered to the pellicle frame 3 via such particular soldering materials, then there should be little fear of detachment and outgas unlike the situation wherein organic adhesive is used.

In the case of EUV exposure procedure, the pellicle membrane should be made of a material having a high transmitting characteristic against EUV light such as single crystal silicon, polycrystalline silicon or amorphous silicon, and ought to have a thickness of 1 μm or smaller or preferably 20 nm through 1 μm. Also, for the purpose of protecting the pellicle membrane 1, it is also possible to provide a protective film of SiC, $SiO_2$, $Si_3N_4$, SiON, $Y_2O_3$, YN, Mo, Ru or Rh. Furthermore, it is possible that, for the purpose of reinforcing the pellicle membrane 1, a support structure may be applied to the pellicle membrane 1, and, for example, a honey-comb structure made of Si can be applied to the pellicle membrane 1.

There is no limit as to the shape of the pellicle frame 3, but in general it is quadrilateral. Also, there is no limit as to the material to make the pellicle frame 3 and any conventionally adopted material may be used. Examples are aluminum, aluminum alloy (JIS 5000 series, 600 series, 7000 series, etc.), iron, iron-based alloy, ceramics (SiC, AlN, $Al_2O_3$, etc.), ceramics-metal composite material (Al—SiC, Al—AlN, Al—$Al_2O_3$, etc.), carbon steel, tool steel, stainless steel, engineering plastic (PE, PA, PEEK, etc.), and carbon fiber composite material (GFRP, CFRP, etc.). In the case of pellicle for EUV, the material to make the pellicle frame 3 can be selected from those used to make the pellicle frame for excimer laser; however, from the viewpoint of minimizing the deformation caused by the thermal expansion, it is also suitable to adopt Invar or Super Invar or the like which have small thermal expansion coefficients.

The surface of the pellicle frame 3 may be subjected to anodic oxidation treatment, plating treatment, polymer coating, enameling, or the like, depending on the requirement. Also, for the purposes of inhibiting the reflex of the exposure light and improving the visibility of foreign materials during the foreign material inspection, it is preferable that the pellicle frame 3 is black. If an aluminum alloy is used as the base material of the pellicle frame 3, then it is preferable if its surface is first roughened with stainless beads, glass beads, or carborundum, and then it is subjected to a black colored alumite treatment.

As for the adhesive 2 for gluing the pellicle membrane 1 to the pellicle frame 3, as well as for the mask agglutinant 4 for gluing the pellicle frame 3 to the mask 5, there are no limits to them, so that any conventional materials can be adopted form them. For example, to attach the pellicle membrane 1 to the pellicle frame 3, a solvent that dissolves the pellicle membrane well is applied to the upper end face of the pellicle frame 3 and, after pasting the pellicle membrane 1 on it, the solvent and the membrane are dried by air flow; or preferably an adhesive agent such as acrylic resin, silicone resin, or epoxy resin may be used to fix the pellicle membrane 1 on the upper end face of the pellicle frame 3; but in the case of EUV exposure application, it is more preferable that the adhesive 2 for the membrane adhesion is selected from adhesives having low outgassing characteristic.

As for the agglutinant 4 for gluing the pellicle frame 3 to the mask or reticle, it is preferable to use a polybutene resin, a polyvinyl acetate resin, an SEBS (poly(styrene-ethylene-butadiene-styrene)) resin, an acrylic resin, a silicone resin or the like.

The application of the adhesive 2 and the agglutinant 4 can be done by dipping, spraying brush coating or using an application equipment with a dispenser, for example; however, for the reasons of stability, operation efficiency, good yield, etc, it is preferable to use an application equipment with a dispenser.

Also, when the viscosity of the adhesive 2 or that of the agglutinant 4 has a too high viscosity to conduct a smooth application by means of the application apparatus, then, depending on the necessity, it is expedient that the glue is diluted by adding to it an aromatic solvent such as toluene or xylene, an aliphatic solvent such as hexane, octane, isooctane, or isoparaffin, a ketone solvent such as methyl ethyl ketone or methyl isobutyl ketone, an ester solvent such as ethyl acetate or butyl acetate, an ether solvent such as diisopropyl ether or 1,4-dioxane, or a mixture of any of them.

EXAMPLES

Now, the present invention shall be explained in a concrete manner with the help of Examples and Comparative Examples. By the way, the term "mask" used in Examples and Comparative Examples is meant to be an example of "exposure original plate" and it has been confirmed that same results are obtained when a reticle is used in place of the mask.

Example 1

Example 1 is a case where a SUS (stainless steel) filter having a filtration accuracy of 0.3 μm was used. At first, a pellicle frame 3 made of Super Invar (having a contour dimension of 149.4 mm×116.6 mm×1.7 mm and a frame bar width of 2 mm, and provided with a vent hole of 1.0-mm diameter in the middle of one of the shorter frame bars of the pellicle frame 3) was washed with pure water, and thereafter a filter 7 made of stainless steel was fitted to cover the vent hole of 1.0-mm diameter made through the middle part of one shorter frame bar of the pellicle frame 3 by weldering the filter 7 to the pellicle frame 3 so that the two bodies were merged to form one continuous body.

Next, a silicone potting agent (Product Name: KE-101A/B) manufactured by Shin-Etsu Chemical Co., Ltd. was applied to both the upper and the lower end faces of the pellicle frame 3, and a pellicle membrane 1 of singe crystal silicon having a thickness of 0.28 μm and backed up by a porous structure was adhered to the upper end face; then that portion of the membrane which extended beyond the contour of the pellicle frame 3 was trimmed off and hence a pellicle 10 was completed.

Then, this pellicle 10 was fixed on a 150-mm square mask substrate, and this mask substrate together with the pellicle 10 was placed in a decompressor box, and the pressure therein was reduced gradually so as to avoid breakage of the pellicle membrane 1; it took fifteen minutes for the pressure to go down to 1 kPa. Then, this pellicle 10 was subjected to a heating test at 200° C. for one hour, but the filter 7 was observed to have no damage.

Example 2

Example 2 is a case in which a SUS filter having a filtration accuracy of 0.1 μm was used. In this Example 2, a pellicle 10 was fabricated in the same manner as in Example 1 except that the filter used was of a filtration accuracy of 0.1 μm; when the pressure reduction was conducting in the same manner as in Example 1, it took 30 minutes for the pressure to reach 1 kPa. Also, this pellicle 10 was subjected to the heating test at 200° C. for one hour, and the filter 7 was observed to have no damage.

Example 3

Example 3 is a case wherein a ceramic filter having a filtration accuracy of 0.3 μm was used. At first, a pellicle frame 3 made of Super Invar (having a contour dimension of 149.4 mm×116.6 mm×1.7 mm and a frame bar width of 2 mm, and provided with a vent hole of 1.0-mm diameter in the middle of one of the shorter frame bars of the pellicle frame 3) was washed with pure water, and thereafter a ceramic filter 7 with its surface metallized and having a filtration accuracy of 0.3 μm was fitted to cover the vent hole of 1.0-mm diameter made through the middle part of one shorter frame bar of the pellicle frame 3 by soldering the surface of the filter 7 to the pellicle frame 3.

Next, a silicone potting agent (Product Name: KE-101A/B) manufactured by Shin-Etsu Chemical Co., Ltd. was applied to both the upper and the lower end faces of the pellicle frame 3, and a pellicle membrane 1 of single crystal silicon having a thickness of 0.28 μm and backed up by a porous structure was adhered to the upper end face; then that portion of the membrane which extended beyond the contour of the pellicle frame 3 was trimmed off and hence a pellicle 10 was completed.

Then, this pellicle 10 was fixed on a 150-mm square mask substrate, and this mask substrate together with the pellicle 10 was placed in a decompressor box, and the pressure therein was reduced gradually so as to avoid breakage of the pellicle membrane 1; it took fifteen minutes for the pressure to go down to 1 kPa. Then, this pellicle 10 was subjected to a heating test at 200° C. for one hour, but the filter 7 was observed to have no damage.

Example 4

Example 4 is a case in which the pellicle membrane 1 was a single crystal silicon membrane having a thickness of 0.83 μm. In this Example 4, a pellicle 10 was fabricated in the same manner as in Example 2 except that the single crystal silicon pellicle membrane 1 had a thickness of 0.83 μm; when the pressure reduction was conducting in the same manner as in Example 1, it took 20 minutes for the pressure to reach 1 kPa. Also, this pellicle 10 was subjected to the heating test at 200° C. for one hour, and the filter 7 was observed to have no damage.

Comparative Example 1

Comparative Example 1 is a case in which a SUS filter having a filtration accuracy of 0.05 μm was used. In this Comparative Example 1 a pellicle 10 was fabricated in the same manner as in Example 1 except that a single crystal silicon pellicle membrane 1 having a thickness of 0.83 μm as well as the stainless steel filter having the filtration accuracy of 0.05 μm were used; also the same vacuum drawing test as in Example 1 was conducted, in which it took 60 minutes to reach the pressure of 1 kPa. Furthermore, the pellicle 10 was subjected to the heating test at 200° C. for one hour, and the filter 7 was observed to incur no damage.

Comparative Example 2

Comparative Example 2 is a case in which a SUS filter having a filtration accuracy of 0.5 μm was used. In this Comparative Example 2 a pellicle 10 was fabricated in the same manner as in Example 1 except that the stainless steel filter having the filtration accuracy of 0.5 μm was used; also the same vacuum drawing test as in Example 1 was conducted, in which it took 7 minutes to reach the pressure of 1 kPa. Furthermore, the pellicle 10 was subjected to the heating test at 200° C. for one hour, and the filter 7 was observed to incur no damage.

Comparative Example 3

Comparative Example 3 is a case in which a filter made of an organic material and having a filtration accuracy of 0.3 μm was used. At first, a pellicle frame 3 made of Super Invar (having a contour dimension of 149.4 mm×116.6 mm×1.7 mm and a frame bar width of 2 mm, and provided with a vent hole of 1.0-mm diameter in the middle of one of the shorter frame bars of the pellicle frame 3) was washed with pure water, and thereafter a filter 7 made of PTFE was fitted to cover the vent hole of 1.0-mm diameter made through the middle part of one shorter frame bar of the pellicle frame 3 by gluing the filter 7 to the pellicle frame 3 with an adhesive.

Next, a silicone potting agent (Product Name: KE-101A/B) manufactured by Shin-Etsu Chemical Co., Ltd. was applied to both the upper and the lower end faces of the pellicle frame 3, and a pellicle membrane 1 of singe crystal silicon having a thickness of 0.28 μm and backed up by a porous structure was adhered to the upper end face; then that portion of the membrane which extended beyond the contour of the pellicle frame 3 was trimmed off and hence a pellicle 10 was completed.

Then, this pellicle 10 was fixed on a 150-mm square mask substrate, and this mask substrate together with the pellicle 10 was placed in a decompressor box, and the pressure therein was reduced gradually so as to avoid breakage of the pellicle membrane 1; it took fifteen minutes for the pressure to go down to 1 kPa. Then, this pellicle 10 was subjected to a heating test at 200° C. for one hour, but the filter 7 was observed to have no damage.

<Foreign Matter Test>

With respect to each pellicle 10 of Examples 1 through 4 and Comparative Examples 1 through 3, the collection efficiency of foreign matter of the respective filter 7 was examined under the following test conditions, and the results were as shown in Table 1.

<Conditions for Foreign Matter Test>
Measurement area: 9.6 cm$^2$
Flow rate: 2 mL/min

TABLE 1

|  | material and filtration accuracy | thickness of pellicle membrane (μm) | vacuum drawing time required (minutes) | heat resistance at 200° C. | foreign matter collection efficiency (%)* | adhesion method | damage | overall evaluation |
|---|---|---|---|---|---|---|---|---|
| Example 1 | stainless steel 0.3 μm | 0.28 | 15 | good | 99.9 | welding | none | acceptable |

TABLE 1-continued

|  | material and filtration accuracy | thickness of pellicle membrane (μm) | vacuum drawing time required (minutes) | heat resistance at 200° C. | foreign matter collection efficiency (%)* | adhesion method | damage | overall evaluation |
|---|---|---|---|---|---|---|---|---|
| Example 2 | stainless steel 0.1 μm | 0.28 | 30 | good | 99.9 | weldering | none | acceptable |
| Example 3 | ceramic 0.3 μm | 0.28 | 15 | good | 99.9 | soldering | none | acceptable |
| Example 4 | stainless steel 0.1 μm | 0.83 | 20 | good | 99.9 | weldering | none | acceptable |
| Comparative Example 1 | stainless steel 0.05 μm | 0.83 | 60 | good | 99.9 | weldering | none | unacceptable |
| Comparative Example 2 | stainless steel 0.5 μm | 0.28 | 7 | good | 83.2 | weldering | none | unacceptable |
| Comparative Example 3 | PTFE 0.3 μm | 0.28 | 15 | bad | 99.9 | adhesive | filter detached | unacceptable |

*Foreign matter grain size was 0.3 μm or greater.

According to the results shown in Table 1, in the case of the filters of Examples 1 through 3, the vacuum drawing time required to reach 1 kPa was as short as 30 minutes or even shorter—hence they have high air pass speeds; and furthermore, each filter did not incur damage or detachment from the pellicle frame so that they are evaluated to be excellent in heat resistance at the high temperature of 200° C.; also they had a high foreign matter collection efficiency of 99.9%.

On the other hand, in the case of the filter of Comparative Example 1, although its foreign matter collection efficiency was as excellent as 99.9%, its filtration accuracy was 0.05 μm so that the air pass speed was very slow and thus it took as much as 60 minutes to evacuate the closed space of the mask-pellicle coupling. Then, in the case of the filter of Comparative Example 2, since its filtration accuracy was 0.5 μm the air pass speed was fast and the required vacuum drawing time was so short as 7 minutes; however the foreign matter collection efficiency was so low as 83.2%. Next, in the case of the filter of Comparative Example 3, the air pass speed was fast and the foreign matter collection efficiency was as good as 99.9%; however since it was made of PTFE, its heat resistance was so poor that the filter 7 was found to have detached from the pellicle frame.

It is therefore confirmed from the above results that a pellicle that is suitable for EUV exposure procedure, which is conducted in a vacuum or a reduced pressure atmosphere, is such that its filter is made of metal or ceramic and has a filtration accuracy of 0.1 through 0.3 μm, and it was also confirmed that the filter ought to be attached to the pellicle frame either by welding in a manner such that the filter is continuously connected with the pellicle frame to form one body therewith, or by soldering with a soldering material.

EXPLANATION OF REFERENCE NUMERALS

1: pellicle membrane
2: adhesive
3: pellicle frame
4: agglutinant
5: photomask
6: vent hole
7: filter
10: pellicle

What is claimed is:

1. A pellicle for EUV exposure lithography, comprising
(i) a pellicle frame having an upper end face and provided with a vent hole for air pressure adjustment, said vent hole being covered with a filter for stopping particles from entering said vent hole, and
(ii) a pellicle membrane having a thickness of 1 μm or less, made of single crystal silicon, polycrystalline silicon, or amorphous silicon, and tensely adhered to said upper end face of said pellicle frame;
wherein said filter is made of a metal or a ceramic, said filter is integrally adhered to the pellicle frame either by welding or by soldering, and that the said filter has a filtration accuracy in a range of 0.1 through 0.3 μm, which means that in a test wherein a filter size is 36 mm in diameter and an air flow rate is 2.95 L/min./cm$^2$ and particles having a grain size of 0.1 through 0.3 μm are passed through the filter, then an initial removal efficiency of the filter tested is 88% or greater.

2. The pellicle for EUV exposure lithography according to claim 1, wherein the filter is made of metal.

3. The pellicle for EUV exposure lithography according to claim 2, wherein the filter is made of metal selected from the group of stainless steel, hastelloy, monel, inconel, and nickel.

4. The pellicle for EUV exposure lithography according to claim 1, wherein the filter is made of ceramic.

5. The pellicle for EUV exposure lithography according to claim 4, wherein the filter is made of ceramic selected from the group of titania, zirconia, ferrite, alumina, zircon, and mullite.

6. The pellicle for EUV exposure lithography according to claim 1, wherein the pellicle membrane is made of single crystal silicon.

7. The pellicle for EUV exposure lithography according to claim 1, wherein the pellicle membrane is made of polycrystalline silicon.

8. The pellicle for EUV exposure lithography according to claim 1, wherein the pellicle membrane is made of amorphous silicon.

9. The pellicle for EUV exposure lithography according to claim 1, wherein thickness of the pellicle membrane is in a range of 20 nm to 1 μm.

10. The pellicle for EUV exposure lithography according to claim 1, wherein thickness of the pellicle membrane is in a range of 100 nm to 1 μm.

11. The pellicle for EUV exposure lithography according to claim 1, wherein the filter is adhered to the pellicle frame by welding.

12. The pellicle for EUV exposure lithography according to claim 1, wherein the filter is adhered to the pellicle frame by soldering and a solder alloy used has a melting point lower than those of the pellicle frame and the filter.

13. The pellicle for EUV exposure lithography according to claim 1, wherein the pellicle membrane is coated with a protective film of a material selected from the group of SiC, $SiO_2$, $Si_3N_4$, SiON, $Y_2O_3$, YN, Mo, Ru and Rh.

* * * * *